(12) United States Patent
Yoshimura et al.

(10) Patent No.: US 7,880,308 B2
(45) Date of Patent: Feb. 1, 2011

(54) SEMICONDUCTOR DEVICE

(75) Inventors: Atsushi Yoshimura, Yokosuka (JP); Yoshiaki Sugizaki, Oita (JP)

(73) Assignee: Kabushiki Kaisha Toshiba, Tokyo (JP)

(*) Notice: Subject to any disclaimer, the term of this patent is extended or adjusted under 35 U.S.C. 154(b) by 941 days.

(21) Appl. No.: 11/602,323

(22) Filed: Nov. 21, 2006

(65) Prior Publication Data
US 2007/0120248 A1 May 31, 2007

(30) Foreign Application Priority Data
Nov. 25, 2005 (JP) ............................. 2005-340233

(51) Int. Cl.
- H01L 23/48 (2006.01)
- H01L 23/52 (2006.01)
- H01L 29/40 (2006.01)

(52) U.S. Cl. ............... 257/775; 257/786; 257/E23.063; 257/E23.068; 257/E23.172; 257/E23.175

(58) Field of Classification Search ................. 257/775, 257/786, E23.063, E23.068, E23.07, E23.172, 257/E23.175
See application file for complete search history.

(56) References Cited

U.S. PATENT DOCUMENTS

| | | | | |
|---|---|---|---|---|
| 6,025,648 A | * | 2/2000 | Takahashi et al. | 257/778 |
| 6,469,374 B1 | * | 10/2002 | Imoto | 257/686 |
| 6,472,734 B2 | | 10/2002 | Arakawa et al. | |
| 2004/0238948 A1 | * | 12/2004 | Shiozawa et al. | 257/723 |
| 2006/0079020 A1 | * | 4/2006 | Omizo et al. | 438/107 |

FOREIGN PATENT DOCUMENTS

| JP | 05-062979 | 3/1993 |
|---|---|---|
| JP | 2000-174064 | 6/2000 |
| JP | 2001-250907 | 9/2001 |
| JP | 2002-57276 | 2/2002 |
| JP | 2002057276 A | * 2/2002 |
| JP | 2003-218158 | 7/2003 |
| JP | 2003218158 A | * 7/2003 |

OTHER PUBLICATIONS

Notice of Reasons for Rejection mailed on Aug. 18, 2009, by the Japanese Patent Office in copending Application No. 2005-340233 and English language translation thereof.

Final Notice of Rejection of Feb. 2, 2010, by the Japanese Patent Office in copending Application No. 2005-340233 and English language translation thereof.

* cited by examiner

*Primary Examiner*—Minh-Loan T Tran
*Assistant Examiner*—Leslie Pilar Cruz
(74) *Attorney, Agent, or Firm*—Finnegan, Henderson, Farabow, Garrett & Dunner, L.L.P.

(57) ABSTRACT

There is disclosed a semiconductor device comprising at least two substrates, at least one wiring being provided in each of the substrates, the substrates being stacked such that major surfaces on one side of each thereof oppose each other and the wirings being connected between the major surfaces, and a plurality of connecting portions being provided adjacent to each other while connected to each wiring on the major surfaces opposing each other, at least one of the connecting portions provided on the same major surface being formed smaller than the adjacent other connecting portion, the connecting portions being provided at positions opposing each other one to one on the major surface, the connecting portions being connected so that the wirings are connected between the major surfaces, one connecting portion of a pair of the connecting portions connected one to one being formed smaller than the other connecting portion.

14 Claims, 11 Drawing Sheets

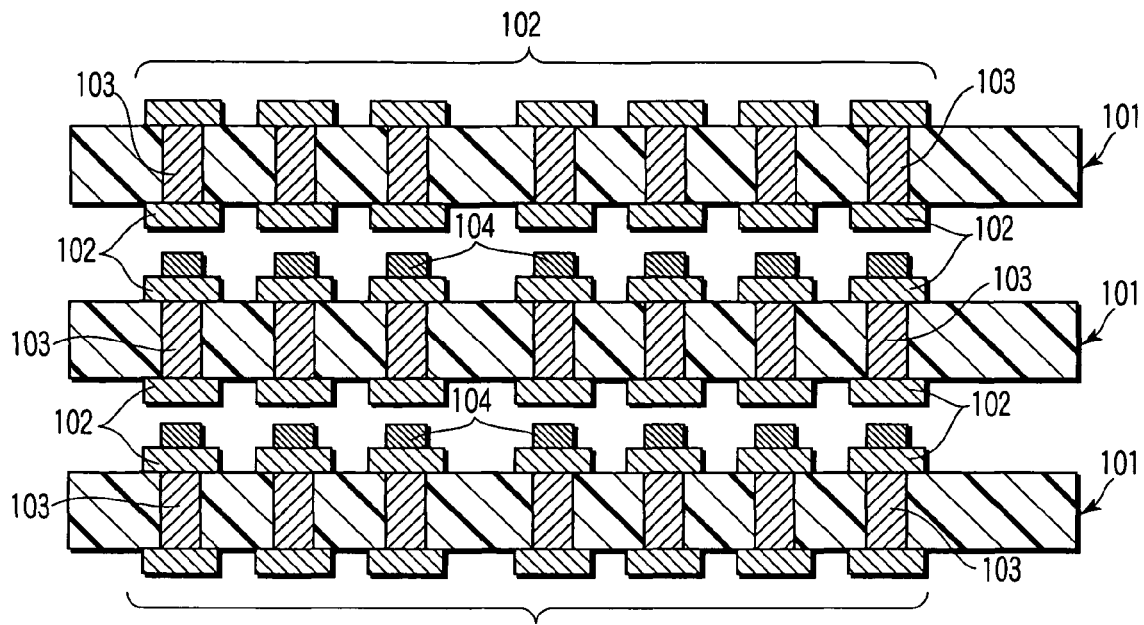
F I G. 5
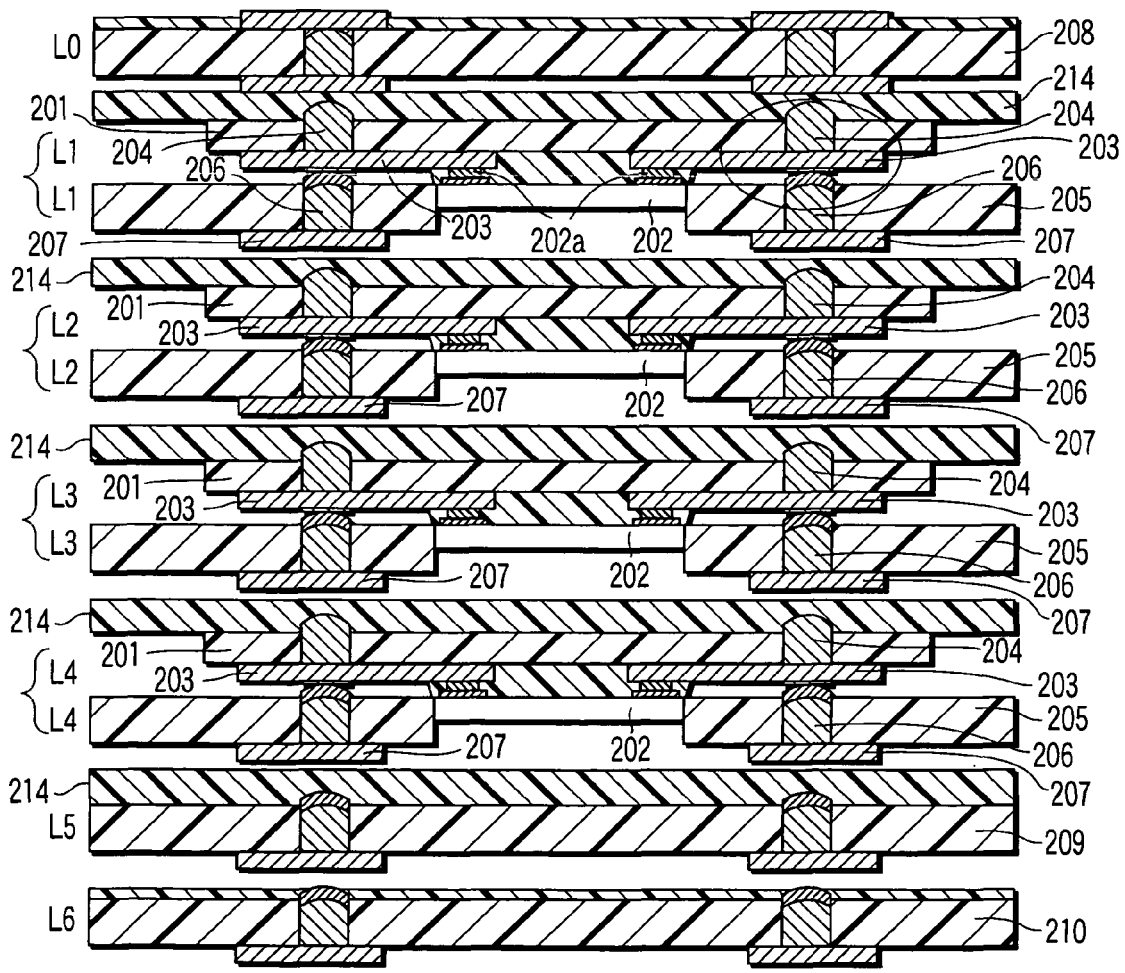
F I G. 7

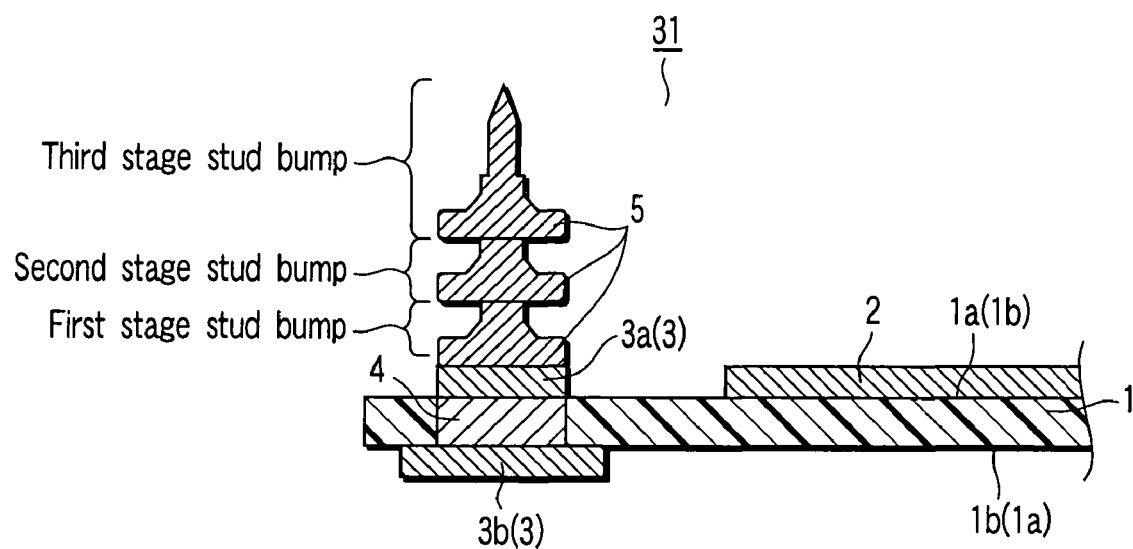
F I G. 18

SEMICONDUCTOR DEVICE

CROSS-REFERENCE TO RELATED APPLICATIONS

This application is based upon and claims the benefit of priority from prior Japanese Patent Application No. 2005-340233, filed Nov. 25, 2005, the entire contents of which are incorporated herein by reference.

BACKGROUND OF THE INVENTION

1. Field of the Invention

The present invention relates to a semiconductor device having a stacked structure in which a plurality of base materials are stacked in multiple layers and more particularly to a semiconductor device in which a plurality of wirings provided on each base material are connected to one another between respective adjacent base materials.

2. Description of the Related Art

In recent years, demands for intensified density (higher integration) and reduced size in the semiconductor device have been rising. To realize this, technologies for stacking a plurality of the base materials (substrates) in multiple layers have been developed. In such technologies, a mounting method for stacking a plurality of substrates each loaded with a semiconductor chip three-dimensionally in the thickness direction thereof and mounting these substrates on a single mother substrate has been proposed.

A plurality of wirings are provided on both front and rear major surfaces of a substrate (core layer, core substrate) for a general stacked structure. Each wiring has at least a connection terminal called land. Each land provided on one major surface of each substrate (wiring board) and each land provided on the other major surface are connected to each other through a via plug (via wiring) provided inside each wiring board. Usually, when respective wiring boards are stacked and bonded to each other, the lands opposing each other along the stacking direction are connected so that the respective wirings of the respective wiring boards are connected between adjacent wiring boards.

When respective wiring boards having such a structure are bonded to each other by stacking them, usually, the positions of the respective wiring boards in the vertical direction are aligned using a positioning pin or the like prior to bonding work so that lands of the respective wiring boards are connected as an appropriate pair (conduction passage) determined preliminarily. However, usually, the wiring pattern of each wiring differs depending on each wiring board or each major surface. Then, a displacement originated from a difference in wiring pattern always exists between the respective wirings opposing each other between upper and lower layers. That is, a so-called scale factor difference always exists between the respective wirings opposing each other between the upper and lower layers. Generally, a drilling accuracy of drilling a hole through which a positioning pin is to be passed in each wiring board and a clearance between the hole for the positioning pin provided in each wiring board and the positioning pin and the like are different depending on each wiring board. The displacement is always generated between the respective lands opposing each other or adjacent respective wiring boards due to these reasons.

If such a displacement exits, the likelihood that lands provided on major surfaces opposing each other of adjacent wiring boards may make contact with each other although they must not be connected to each other thereby causing a short-circuit is increased. Alternatively, the likelihood that a land provided on one major surface of the respective major surfaces opposing each other may not make contact with any land provided on the other major surface is increased. If a displacement occurs between lands opposing each other or wiring boards adjacent to each other, contact failure (conduction failure) of wirings between the respective wiring boards is likely to occur. As a result, the likelihood that the performance, quality, reliability and yield of the entire semiconductor device may drop is increased. Finally, the likelihood that production efficiency of the semiconductor device may drop thereby increasing production cost is increased.

To prevent such a problem, for example, Jpn. Pat. Appln. KOKAI Publication No. 2002-57276 has disclosed a method for increasing the diameter of each land. According to this method, naturally, an allowance (allowable error) of displacement between the opposing lands and allowance of displacement of the stacking position between the stacked wiring substrates can be relaxed. However, in this method, an interval (connecting pitch) between respective lands provided adjacent to each other on the same major surface increases. Naturally, the connecting pitch between the lands on a mating to be connected to such a large diameter land also increases. Therefore, demands for intensifying the density and reducing the size of the semiconductor device are extremely difficult to achieve with this method.

BRIEF SUMMARY OF THE INVENTION

According to an aspect of the invention, there is provided a semiconductor device comprising:

at least two substrates, at least one wiring being provided in each of the substrates, the substrates being stacked such that major surfaces on one side of each thereof oppose each other and the wirings being connected between the major surfaces; and a plurality of connecting portions, the connecting portions being provided adjacent to each other while connected to each wiring on the major surfaces opposing each other, at least one of the connecting portions provided on the same major surface being formed smaller than the adjacent other connecting portion, the connecting portions being provided at positions opposing each other one to one on the major surface, the connecting portions being connected so that the wirings are connected between the major surfaces, one connecting portion of a pair of the connecting portions connected one to one being formed smaller than the other connecting portion.

BRIEF DESCRIPTION OF THE SEVERAL VIEWS OF THE DRAWING

FIG. 5 is a sectional view of process showing a first comparative example of the first embodiment;

FIG. 7 is a sectional view of process showing a second comparative example of the first embodiment;

FIG. 18 is a sectional view of process showing manufacturing method of a semiconductor device according to a third embodiment.

DETAILED DESCRIPTION OF THE INVENTION

Hereinafter the embodiments of the present invention will be described with reference to the accompanying drawings.

First Embodiment

Figure 1:
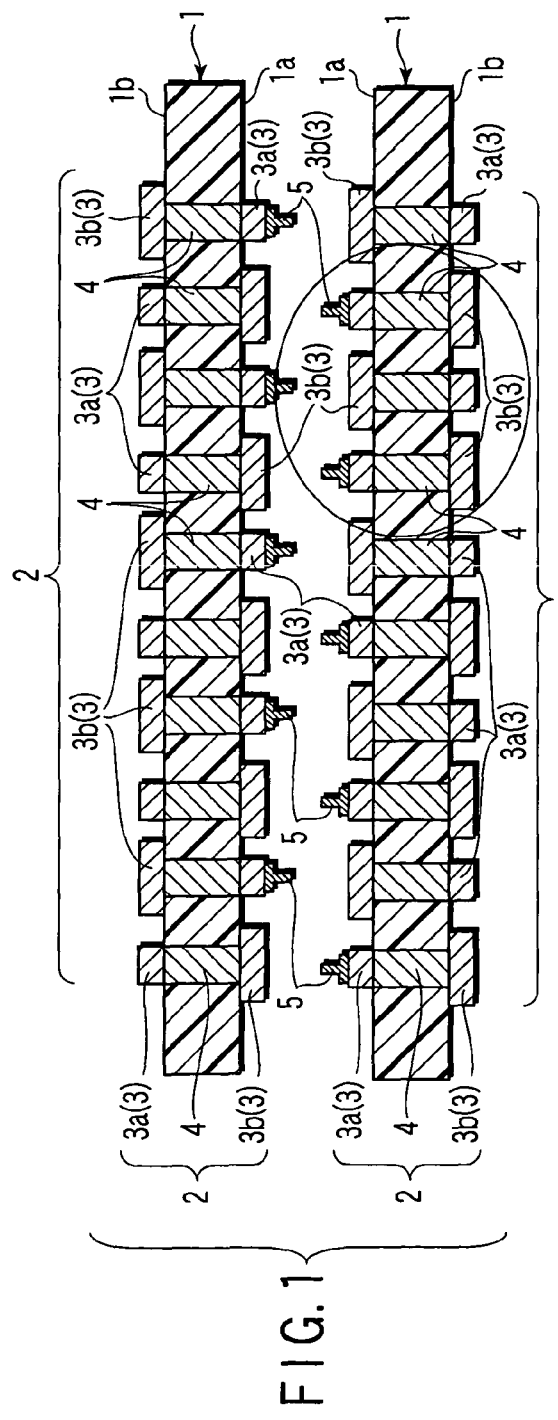
FIG. 1 is a sectional view of process showing manufacturing method of semiconductor device according to a first embodiment.
Figure 4:
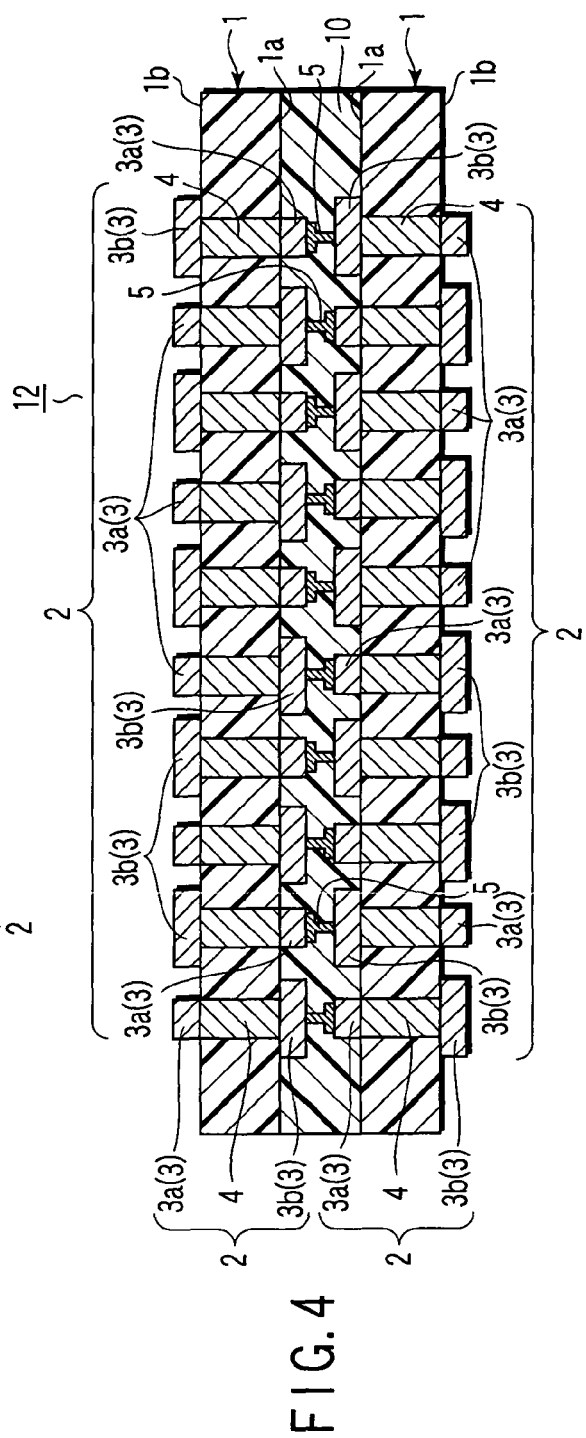
FIG. 4 is a sectional view of process showing manufacturing method of the semiconductor device according to the first embodiment.
Figure 2:
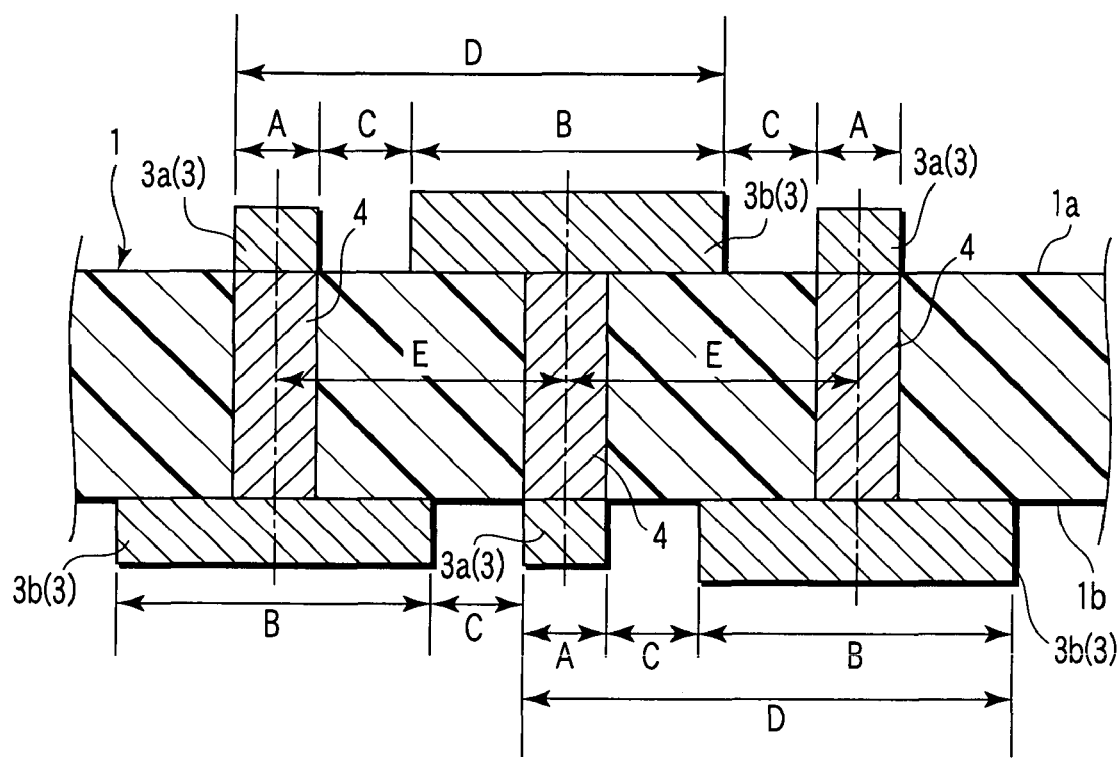
FIG. 2 is a sectional view showing a portion surrounded by a solid line circle in FIG. 1 in enlargement.
Figure 3:
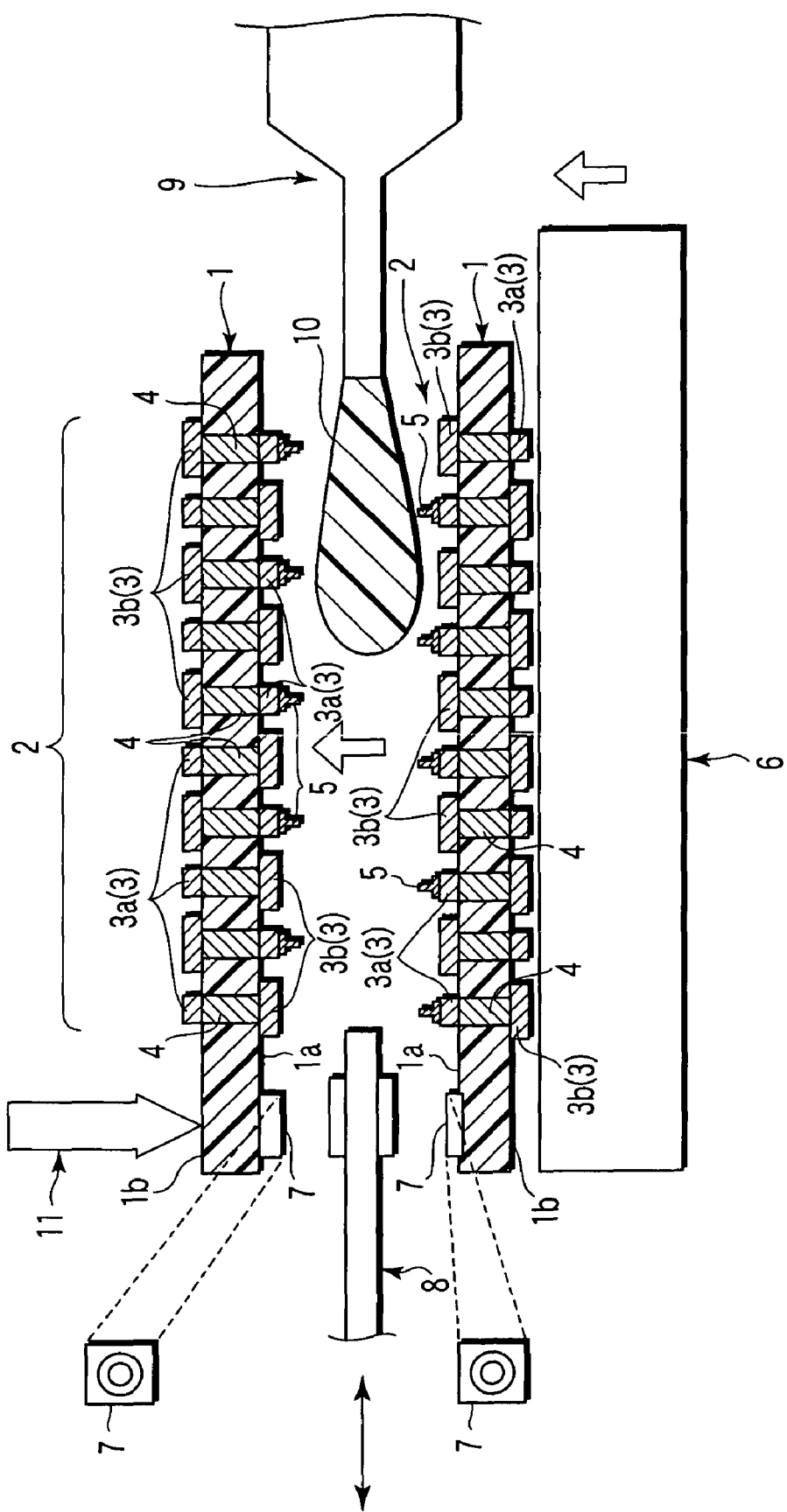
FIG. 3 is a sectional view of process showing manufacturing method of the semiconductor device according to the first embodiment.

First, a first embodiment of the present invention will be described with reference to FIGS. 1 to 4. FIGS. 1, 3, 4 are sectional views of process showing manufacturing method of a semiconductor device of this embodiment. FIG. 2 is a sectional view showing a portion surrounded by a solid line circle in FIG. 1 in enlargement. In FIGS. 1 to 4, representation of the semiconductor element (semiconductor chip) is omitted.

This embodiment concerns so-called stacked-type semiconductor device in which a plurality of base materials (wiring base materials) provided with a plurality of wirings are stacked three-dimensionally in multiple layers. More specifically, this embodiment concerns a stacked-type semiconductor device in which two pieces of wiring materials are stacked as two upper and lower layers in the thickness direction while respective wirings of the respective wiring base materials are connected between the upper and lower wiring base materials. Hereinafter, this embodiment will be described in detail.

First, as shown in FIG. 1, two pieces of base materials 1 are arranged as two upper and lower layers such that their major surfaces 1a oppose each other. Hereinafter, the major surface 1a of each of the base materials 1 which oppose each other is referred to as first major surface. A major surface 1b on an opposite side to the first major surface 1a, which is the other major surface of each base material 1 is referred to as a second major surface. Each base material 1 is formed of resin having insulation property such as polyimide, glass epoxy, BT resin, PET, PCB and may be formed of other material having flexibility (plasticity). Each base material 1 is called a core layer or core substrate. A plurality of wirings 2 are provided on the first major surface 1a and the second major surface 1b of each base material 1. Each wiring 2 is formed of for example, copper (Cu) or aluminum (Al). Hereinafter each base material 1 is called wiring board (wiring base material).

As shown in FIG. 1, a plurality of connecting portions 3 for connecting the wirings 2 on each of upper and lower wiring boards 1 between the respective first major surface 1a are provided on each first major surface 1a of the upper and lower wiring boards 1 such that they are connected to the wirings 2. These connecting portions 3 are arranged such that they are arranged in line adjacent to each other on the first major surface 1a. At the same time, the connecting portions 3 on the first major surface 1a of the upper (upper layer) wiring board 1 and the connecting portions 3 on the first major surface 1a of the lower (lower layer) wiring board 1 are provided at positions in which they oppose each other one to one between the upper and lower wiring boards 1 (upper and lower first major surfaces 1a). In this embodiment, a plurality of the connecting portions 3 are connected to the wirings 2 on the second major surface 1b of each of the upper and lower wiring boards 1 also, such that they are arranged in line adjacent to each other. The connecting portions 3 on the second major surfaces 1b of the upper and lower wiring boards 1 are provided to oppose the connecting portions 3 one to one on the first major surface 1a of each of the upper and lower wiring boards 1 across each of the upper and lower wiring boards 1.

As shown in FIG. 1, a plurality of via plugs 4 are provided as base material inside connecting conductor inside each of the upper and lower wiring boards 1 such that they penetrate through each of the upper and lower wiring boards 1 in the thickness direction. Then, the connecting portions 3 provided on the first major surface 1a of each of the upper and lower wiring boards 1 are connected to the connecting portions 3 provided on the second major surface 1b one to one through each via plug 4. That is, the wirings 2 provided on the first major surface 1a of each of the upper and lower wiring boards 1 are connected to the wirings 2 provided on the second major surfaces 1b through each via plug 4 provided inside each of the upper and lower wiring boards 1. The connecting portions 3 provided on the first major surface 1a and the second major surface 1b of each of the upper and lower wiring boards 1 and the via plugs 4 provided inside each of the upper and lower wiring boards 1 constitute part of each wiring 2.

As shown in FIG. 1, the connecting portions 3 are divided to two different sizes, large and small. That is, the connecting portions 3 are formed into a small connecting portion 3a or a large connecting portion 3b. In a following description, the small connecting portion 3a is called first connecting portion and the large connecting portion 3b is called second connecting portion. The first connecting portion 3a and the second connecting portion 3b are provided alternately on each of the first and second major surfaces 1a, 1b of each of the upper and lower wiring boards 1. Here, an interval between the first connecting portion 3a and the second connecting portion 3b adjacent to each other along the first and second major surfaces 1a, 1b is specified to be a pitch. As a result, the first connecting portion 3a and the second connecting portion 3b are arranged alternately at plural positions continuously by each pitch along the first and second major surfaces 1a, 1b.

As shown in FIG. 1, the first connecting portions 3a and the second connecting portions 3b are provided at positions in which they oppose each other one to one between the opposing first major surfaces 1a. That is, the first connecting portions 3a and the second connecting portions 3b are arranged alternately on the upper and lower layers at plural positions continuously by pitch along each first major surface 1a between the first major surfaces 1a opposing each other. Thus, each first connecting portion 3a is connected to each second connecting portion 3b between the opposing first major surfaces 1a. That is, the connecting portions 3 are connected to the connecting portions 3 having a different size one to one between the opposing first major surfaces 1a.

As shown in FIG. 1, the first connecting portions 3a and the second connecting portions 3b are also provided at positions in which they oppose each other one to one between the first major surface 1a and the second major surface 1b of each of the upper and lower wiring boards 1. That is, the first connecting portions 3a provided on the first major surface 1a are connected to the second connecting portions 3b provided on the second major surface 1b one to one through each via plug 4 in both the upper and lower wiring boards 1. Likewise, the second connecting portions 3b provided on the first major surface 1a are connected to the first connecting portions 3a provided on the second major surface 1b one to one through each via plug 4.

In this embodiment, the first connecting portion 3a is formed in a width equal to or smaller than the width of each wiring 2. More specifically, the first connecting portion 3a is part (an end portion) of each wiring 2 or a connecting terminal for connecting the base materials (connecting land) having a diameter equal to the width of each wiring 2. Contrary to this, the second connecting portion 3b is formed larger than the width of each wiring 2. More specifically, the second connecting portion 3b is a connecting terminal for connecting the base materials (connecting land) having a diameter larger than the width of each wiring 2. In a following description, the first connecting portion 3a is called first land which is a smaller connecting terminal for connecting the base materials. The second connecting portion 3b is called second land as a larger connecting terminal for connecting the base materials. In this embodiment, each via plug 4 is formed into the same diameter as the first land 3a. That is, the diameter of each via plug 4 is formed in an equal size to the width of each wiring 2. Thus, in this embodiment, as described later, the interval (pitch) between the adjacent via plugs 4 is equal to the interval (pitch) between the adjacent wirings 2.

As shown in FIG. 1, a conductor 5 for connecting the base materials is provided on an end portion (end face) of the first land 3a provided on each of the first major surfaces 1a opposing each other. That is, like the first land 3a and the second land 3b, the conductors 5 for connecting the base materials are provided on the end faces of the first lands 3a alternately on the upper and lower layers at plural positions continuously by pitch along each first major surface 1a. The conductors 5 for connecting the base materials serve as an electrode for connecting the base materials in order to connect the first connecting portion 3a and the second connecting portion 3b, which are opposed to each other one to one between the respective first major surfaces 1a. More specifically, the conductor 5 for connecting the base materials is an electrode having a projecting shape which is formed projectingly from the side of the first land 3a to the side of the second land 3b arranged to oppose the first land 3a. Then, each electrode 5 is formed in a size equal to or smaller than the first land 3a. According to this embodiment, each electrode 5 is formed according to stud bump method which applies wire bonding method. Therefore, each electrode 5 is specifically a stud bump. Each stud bump 5 is specifically formed as follows.

A predetermined amount of the conductor 5 which is material of bonding wire is supplied to and affixed to the end face of the first land 3a provided on the first major surface 1a using a bonding tool (not shown). After that, with a supply of the conductor 5 stopped, the bonding tool is retracted from the first land 3a. Consequently, a projecting-like stud bump 5 is affixed onto the end face of the first land 3a just as if bonding wire is torn off. Generally, the bonding wire is formed of gold (Au) difficult to oxidize (deteriorate) having a high conductivity. Therefore, preferably, each stud bump 5 is formed of Au. This stud bump method takes a lower cost than general plating method and ensures a high versatility. Further, because the stud bump method can reduce required operation time than the general plating method, it can improve productivity.

In the meantime, although not shown, the stud bumps 5 are provided on the first lands 3a on the second major surface 1b which is a major surface of the side not opposing each other of the upper and lower wiring boards 1. That is, the stud bumps 5 are affixed to both the first and second major surfaces 1a, 1b of the upper and lower wiring boards 1 using the bonding tool. However, in such a substrate structure, the quantity of the stud bumps 5 provided on each wiring board 1 is substantially not different from the quantity of the stud bumps in a general substrate structure provided with the stud bumps only on the major surface of one side of each wiring board. Thus, according to this embodiment, each of the upper and lower wiring boards 1 having the structure shown in FIG. 1 can be manufactured without dropping processing efficiency of process for providing each of the upper and lower wiring boards 1 with each stud bump 5 considerably.

To improve connection status between the first land 3a and the second land 3b via each stud bump 5, preferably, the surface of the first land 3a is plated with Au prior to providing with each stud bump 5 although not shown. At the same time, preferably, the surface of the second land 3b is tinned (with Sn) prior to connecting each stud bump 5.

Next, sizes and a relative positional relation of the first land 3a, second land 3b and via plug 4 which constitute part of the wiring 2 provided on each of the upper and lower wiring boards 1 will be described more in detail with reference to FIG. 2. FIG. 2 is a sectional view showing a portion surrounded by a solid line circle in FIG. 1 in enlargement. In the meantime, in FIG. 2, representation of each stud bump 5 is omitted to make the drawing easier to see.

In this embodiment, the diameter of the first land 3a indicated with A in FIG. 2 is set to about 150 μm. The diameter of the second land 3b indicated with B in FIG. 2 is set to about 350 μm. Then, an interval between the first land 3a and the second land 3b adjacent to each other on each of the first major surface 1a and the second major surface 1b indicated with C in FIG. 2 is set to about 100 μm. Consequently, an interval from an end portion of the first land 3a to an end portion of the second land 3b, those lands being adjacent to each other, indicated with D in FIG. 2 is about 600 μm. An interval between the centers of the via plugs 4 adjacent to each other indicated with E in FIG. 2 is about 350 μm. Naturally, the interval between the center of the first land 3a and the center of the second land 3b, these lands being adjacent to each other, on each of the first major surface 1a and the second major surface 1b is about 350 μm also. Therefore, the interval (pitch) between adjacent wirings 2 of this embodiment can be regarded to be about 350 μm. That is, according to this embodiment, the wirings 2 are provided on each of the upper and lower wiring boards 1 at a pitch of about 350 μm.

Next, while integrating the upper and lower wiring boards 1 having such a structure by bonding, the first lands 3a and the second lands 3b, provided on the first major surface 1a, these lands opposing each other, are connected through the stud bump 5.

More specifically, as shown in FIG. 3, the lower (lower layer) wiring board 1 is placed on a table 6 as a substrate supporting device. In this case, the lower wiring board 1 is placed on the table 6 such that the first major surface 1a is directed upward and the second major surface 1b is opposed to the top face (front surface) of the table 6. At the same time, the upper (upper layer) wiring board 1 is arranged above the lower wiring board 1. At this time, the upper wiring board 1 is arranged above the lower wiring board 1 such that the first major surface 1a is opposed to the first major surface 1a of the lower wiring board 1.

As shown in FIG. 3, positioning marks (alignment marks) 7 are provided on the peripheral portion of the first major surface 1a of each of the upper and lower wiring boards 1 in order to position the upper and lower wiring boards 1 accurately. Then, a positioning camera 8 for detecting each alignment mark 7 on each of the upper and lower wiring boards 1 is inserted into between the upper and lower wiring boards 1 opposed to each other with the above-described posture. The positioning camera 8 notifies a control unit (control computer) (not shown) of a relative displacement (stacking displacement amount) between the upper and lower wiring boards 1 as position correction information by detecting each alignment mark 7 of the upper and lower wiring boards 1. After receiving the position correction information (displacement information) of the upper and lower wiring boards 1 from the positioning camera 8, the control computer rotates or moves the table 6 in a predetermined direction so that the upper wiring board 1 and the lower wiring board 1 come to oppose each other at an appropriate position based on this information. Consequently, the displacement between the upper and lower wiring boards 1 is corrected so that the upper wiring boards 1 and the lower wiring board 1 are stacked over each other at an appropriate position. After the displacement between the upper and lower wiring boards 1 is corrected, the positioning camera 8 is pulled out from between the upper and lower wiring boards 1.

Subsequently, after the displacement is corrected, the upper wiring board 1 and the lower wiring board 1 are bonded to integrate them. More specifically, the table 6 on which the lower wiring board is placed is raised to the upper wiring board 1 as indicated with a blank arrow in FIG. 3. At this time, a predetermined amount of adhesive agent 10 is supplied from the adhesive agent supply nozzle 9 to between the upper wiring board 1 and the lower wiring board 1. The table 6 is raised until each stud bump 5 provided on the first land 3a on the first major surface 1a of each of the upper and lower wiring boards 1 makes contact with the opposing second land 3b so that the first land 3a and the second land 3b opposing each other one to one are joined together in an appropriate condition. As a consequence, the upper wiring board 1 and the lower wiring board 1 are pressed against each other via adhesive agent 10 and fixed thereto.

When this compression bonding process is carried out, as shown in FIG. 3, a compression bonding tool 11 is arranged above the upper wiring board 1 in order to control the motion of the upper wiring board 1 from above. The compression bonding tool 11 holds the posture and position of the upper wiring board 1 in an appropriate condition so that when the lower wiring board 1 comes into contact with the upper wiring board 1, the upper wiring board 1 is not tilted or shifted in position or the lower wiring board 1 is pressed at an appropriate pressure against the upper wiring board 1. Consequently, an appropriate pressure is applied to each of the upper and lower wiring boards 1. In such compression bonding process, the positioning pin is unnecessary upon stacking the upper and lower wiring boards 1 and accuracy of stacked layer position between the upper and lower wiring boards 1 can be improved easily. Needless to say, the upper wiring board 1 and the lower wiring board 1 may be bonded to each other not by a mere compression bonding process but thermo compression bonding.

In the preceding processes, as shown in FIG. 4, a stacked-type semiconductor device 12 having a desired stacked structure is obtained. That is, in the stacked-type semiconductor device 12, the displacement of stacking position between the upper wiring board 1 and the lower wiring board 1 is set within an allowable error range and the upper wiring board 1 and the lower wiring board 1 are integrated with an appropriate position and posture. At the same time, the first land 3a provided on the first major surface 1a of the upper wiring board 1 and the second land 3b provided on the first major surface 1a of the lower wiring board 1 are electrically connected to each other in an appropriate condition through the stud bumps 5. Likewise, the second lands 3b provided on the first major surface 1a of the upper wiring board 1 and the first lands 3a provided on the first major surface 1a of the lower wiring board 1 are electrically connected to each other in an appropriate condition through the stud bumps 5. That is, the respective wirings 2 provided on the upper wiring board 1 and the respective wirings 2 provided on the lower wiring board 1 are electrically connected through an appropriate conductive passage via the first lands 3a, second lands 3b and stud bumps 5 between the opposing first major surfaces 1a.

According to an experiment conducted by the present inventor et al., it has been shown that the displacement of the stacking position between the upper wiring board 1 and the lower wiring board 1 in the stacking type semiconductor device 12 of this embodiment is about 25 μm, which is much smaller than conventionally.

Next, a first to third comparative examples of this embodiment will be described with reference to FIGS. 5 to 16.

Figure 6:
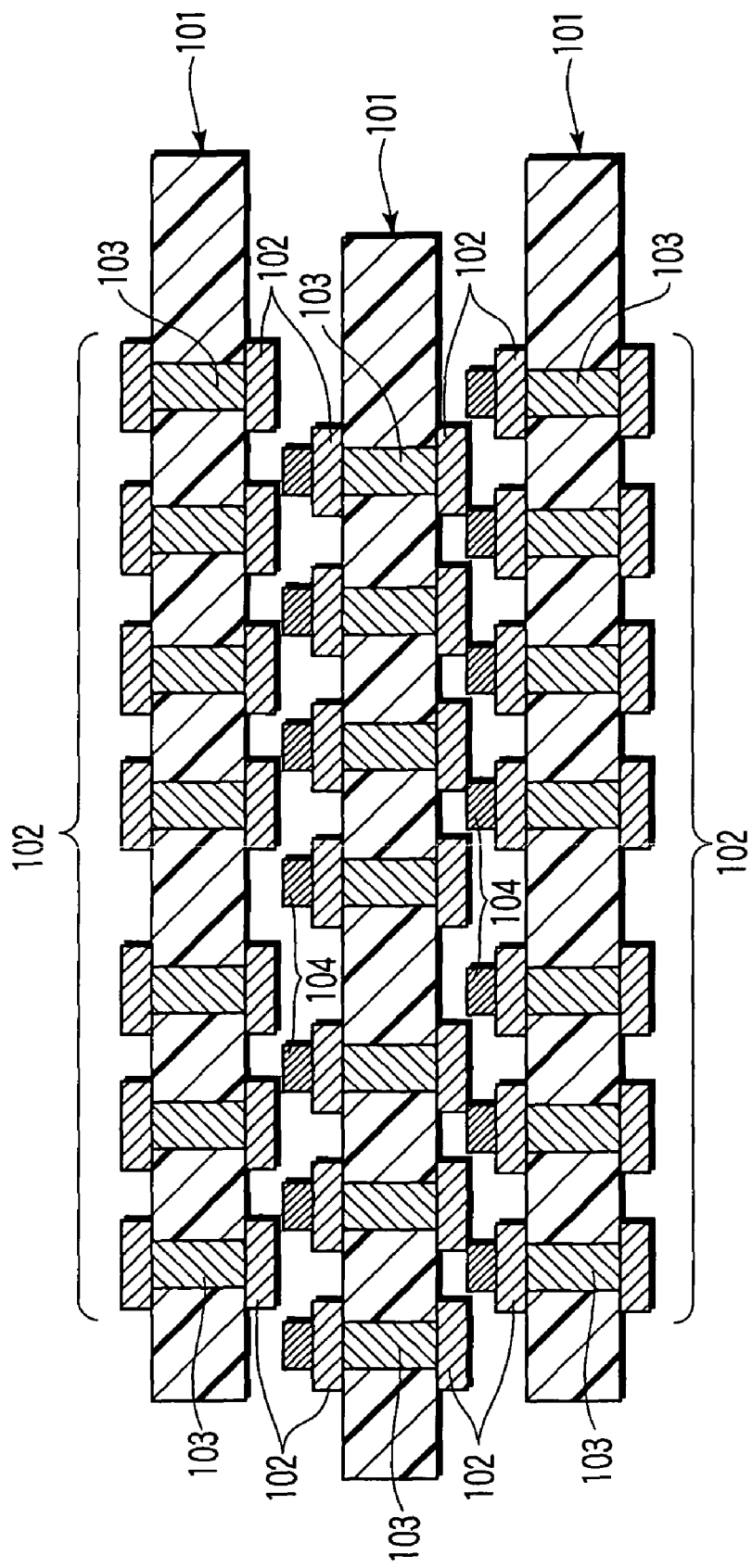
FIG. 6 is a sectional view of process showing the first comparative example of the first embodiment.

First, the first comparative example of this embodiment will be described with reference to FIGS. 5, 6. FIGS. 5, 6 are sectional views of process showing the first comparative example of this embodiment.

As shown in FIG. 5, according to the first comparative example, plural lands 102 provided on both upper and lower (front and rear) major surfaces of each of three wiring boards 101 are all formed in the same size. The diameter of each land 102 is formed larger than the diameter of each via plug 103. In the first comparative example, the diameter of each via plug 103 is set to the same size as the width of each wiring (not shown). Thus, in the first comparative example, the diameter of each land 102 is formed larger than the width of each wiring. The three pieces of the wiring boards 101 having such a structure are stacked three-dimensionally into three layers in the thickness direction thereof. After that, the lands 102 opposing each other one to one between the respective major surfaces of the adjacent wiring boards 101 are connected to each other through the stud bumps 104.

As described in the background art, according to the conventional substrate stacking method, a displacement always occurs between stacked wiring boards 101. If such a displacement occurs between the respective wiring boards 101, the likelihood that the lands 102 which originally must not be connected make contact with each other thereby causing a short-circuit as shown in FIG. 6 is increased. Alternatively, the likelihood that the land 102 provided on one major surface of the opposing major surfaces makes contact with no land 102 provided on the other major surface is increased. These results facilitate generation of contact failure (conduction failure) of the wirings between the respective wiring boards 101.

The displacement of stacking position between the respective wiring boards 101 is generally over about 100 μm. In the first comparative example, the diameter of each via plug 103 is set to about 100 μm. Then, to avoid contact failure between the respective lands 102 due to a displacement, the diameter of each land 102 needs to be set to over about 300 μm. At the same time, an interval (pitch, space) between adjacent lands 102 along each major surface of each wiring board 101 needs to be set to over about 300 μm. As a consequence, the pitch (connection pitch) between the lands 102 capable of avoiding the contact failure between the respective lands 102 due to the displacement between the wiring boards 101 is about 400 μm at minimum. That is, in the first comparative example, the pitch between the wirings capable of avoiding contact failure between the wirings due to a displacement between the wiring boards 101 is about 400μ at minimum. Consequently, it is very difficult to achieve requested intensified density and reduced size of the semiconductor device.

Contrary to this, in the semiconductor device 12 of this embodiment, the pitch between the respective wirings 2 can be set to about 350 μm as described previously. That is, the semiconductor device 12 of this embodiment can be formed at a smaller pitch by about 50 μm than the first comparative example. As a consequence, the requested intensified density and reduced size of the semiconductor device 12 can be easily achieved. Assume that the central positions of connection between the first land 3a and the second land 3b opposing each other between the first major surfaces 1a of the upper and lower wiring boards 1 are slightly displaced from their proper positions. However in such a case also, there is little likelihood that the first land 3a may be connected to the second land 3b which originally must not be connected thereto thereby causing a short-circuit, because the diameter of the second land 3b is formed in a size equal to or larger than the diameter of each land 102 of the first comparative example. Likewise, there is little likelihood that the first land 3a and second land 3b provided on the first major surface 1a on one side may make no contact with the first land 3a and second land 3b provided on the first major surface 1a on the other side.

In the semiconductor device 12 of this embodiment, there is little likelihood that contact failure (connection failure) may occur between the wirings 2 of the upper and lower wiring boards 1. Thus, according to the semiconductor device 12 of this embodiment, the respective wirings 2 can be formed at a smaller pitch while suppressing contact failure between the wirings 2 of the upper and lower wiring boards 1 without relaxing an allowable error between the upper and lower wiring boards 1 with respect to the stacking displacement or an allowable error to a difference in scale factor due to a difference in pattern between the wirings 2 of the upper and lower wiring boards 1.

Figure 8:
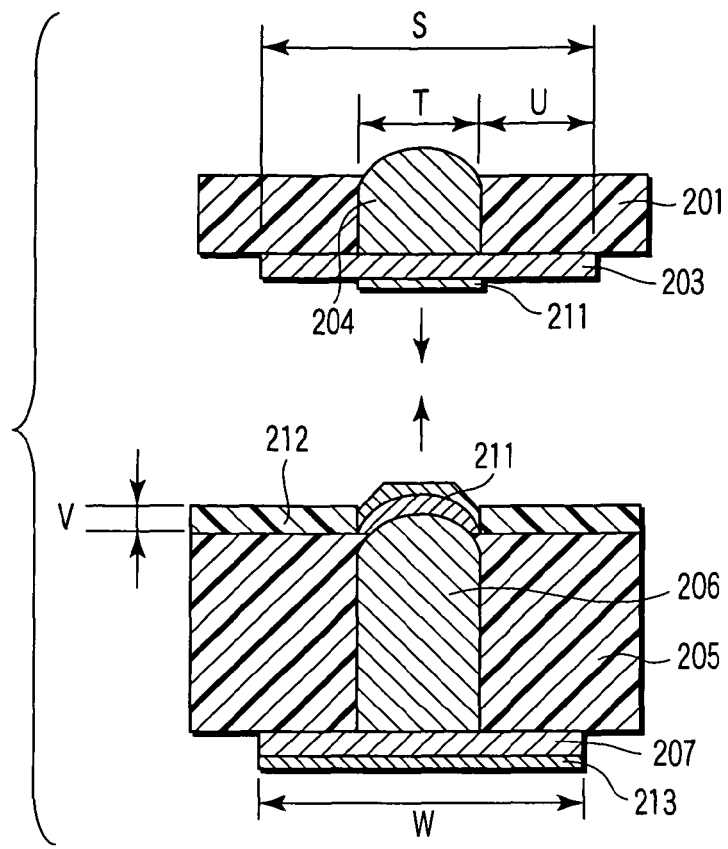
FIG. 8 is a sectional view of a portion surrounded by a solid line circle in FIG. 7 in enlargement.

Next, the second comparative example of this embodiment will be described with reference to FIGS. 7 to 11. FIGS. 7 and 9 to 11 are sectional views of process showing the second comparative example of this embodiment and FIG. 8 is a sectional view showing a portion surrounded with a solid lien circle in FIG. 7 in enlargement.

According to the second comparative example, as shown in FIG. 7, four pieces of the wiring boards 201 are stacked three-dimensionally into four layers, L1 to L4 in the thickness direction thereof. A semiconductor element (semiconductor chip) 202 is mounted on the bottom surface (rear surface) which is one major surface of each of the wiring boards 201. Each semiconductor element 202 is connected to a chip connecting wiring (chip connecting land) 203 provided on the bottom surface of each wiring board (chip mounting substrate) 201 via electrodes 202a. Each chip connecting land 203 is formed of for example Cu. Each chip connecting wiring 203 is connected to a chip connecting via plug 204 which penetrates through each chip mounting substrate 201 in the thickness direction. Each chip connecting via plug 204 is formed of for example, alloy of Sn and silver (Ag). Because the chip mounting substrate 201 is formed as thin as paper, it is called paper thin package (PTP) tape also.

Buffer substrates (spacer substrates) 205 acting as a spacer for preventing each semiconductor element 202 from making contact with the wiring board 201 of adjacent other layer are arranged on the bottom side of the wiring board 201. These spacer substrates 205 are integrated with each chip mounting substrate 201 arranged on the same layer. A relay via plug 206 is provided in each spacer substrate 205 such that it penetrates through in the thickness direction and is connected to the chip connecting wiring 203 in the chip mounting substrate 201 arranged in the same layer. The relay via plug 206 is formed according to a via fill plating method using for example, Cu as its material. A relay wiring (relay land) 207 for connecting the relay via plug 206 to the chip connecting via plug 204 in the chip mounting substrate 201 on the other layer is provided on the major surface on a side not opposing the chip mounting substrate 201 in the same layer of the spacer substrate 205. The relay land 207 is formed of for example, Cu.

A mother board 208 as the substrate of layer L0 is provided above the chip mounting substrate 201 of layer L1 which is a topmost layer of the respective chip mounting substrates 201 stacked in four layers. Further, a first protective substrate 209 as a substrate of layer L5 is provided below the chip mounting substrate 201 of layer L4 which is the bottommost layer. A second protective substrate 210 which is a substrate of layer L6 is provided below this first protective substrate 209. Inter-substrate adhesive agent 214 is provided between the mother board 208 of layer L0 and the chip mounting substrate 201 of layer L1, between the spacer substrate 205 of layer L1 and the chip mounting substrate 201 of layer L2, between the spacer substrate 205 of layer L2 and the chip mounting substrate 201 of layer L3, between the spacer substrate 205 of layer L3 and the chip mounting substrate 201 of layer L4 and between the spacer substrate 205 of layer L4 and the first protective substrate 209 of layer L5.

Next, the dimensions and relative positional relation of the chip connecting land 203 and chip connecting via plug 204 provided on each chip mounting substrate 201 and the relay via plug 206 and relay land 207 provided on each spacer substrate 205 will be described more in detail with reference to FIGS. 8 and 9. FIG. 8 is a sectional view of a portion surrounded with a solid line circle in FIG. 7 in enlargement.

In this second comparative example, the diameter of the chip connecting land 203 indicated with S in FIG. 8 is set to about 350 μm. The diameter of each chip connecting via plug 204 indicated with T in FIG. 8 is set to about 150 μm. Further, a distance from a side face of each chip connecting via plug 204 to an end portion of each chip connecting land 203 indicated with U in FIG. 8 is set to about 100 μm. Further, a plating layer 211 composed of Sn and Ag is provided on the bottom of the chip connecting land 203.

The height of an end portion of the relay via plug 206 projecting from the top face of the spacer substrate 205 indicated with V in FIG. 8 is set to about 0 to 15 μm. A bump 211 having a thickness of about 10 μm is provided on the end portion (end face) of the relay via plug 206. This bump 211 is formed according to a soldering method or plating method. Terminal portion adhesive agent 212 having a thickness of about 15 to 30 μm is provided on the top face of the spacer substrate 205. The diameter of the relay land 207 indicated with W in FIG. 8 is set to about 350 μm. Immersion plating layer 213 composed of Sn having a thickness of about 0.5 μm is provided on the bottom of the relay land 207.

With such a structure, conduction passage is formed by connecting the chip connecting land 203, the chip connecting via plug 204, the relay via plug 206, the relay land 207 and the like as indicated with a solid line in FIG. 8.

Figure 9:
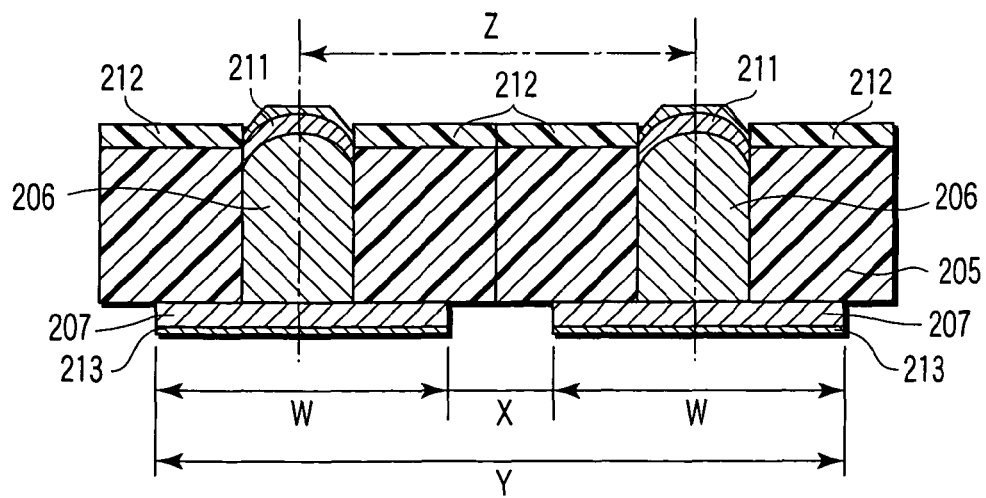
FIG. 9 is a sectional view of process showing the second comparative example of the first embodiment.

The relay via plug 206 and the relay land 207 provided in the spacer substrate 205 are provided adjacent to each other as shown in FIG. 9. In this second comparative example, the interval (pitch) between the adjacent relay lands 207 indicated with X in FIG. 9 is set to about 100 μm. Thus, an interval from an end portion to an end portion of the adjacent relay lands 207 indicated with X in FIG. 9 is about 800 μm. Further, an interval between centers of the relay via plugs 206 adjacent to each other indicated with Z in FIG. 9 is about 450 μm. Naturally, an interval between centers of the adjacent relay lands 207 on the first major surface 1a and the second major surface 1b is about 450 μm. Therefore, the interval (pitch) between adjacent wirings in the second comparative example can be regarded to be about 450 μm. That is, according to the second comparative example, each wiring is provided on each of the upper and lower wiring boards 1 with a single pitch being about 450 μm. As a result, in the second comparative example, intensified density and reduced size of the semiconductor device are much more difficult to achieve than the first comparative example.

Contrary to this, in the semiconductor device 12 of this embodiment, the pitch between the wirings 2 can be set to about 350 μm as described above. That is, the semiconductor device of this embodiment can be formed into a pitch smaller by about 100 μm than the second comparative example. As a consequence, the requested intensified density and reduced size of the semiconductor device 12 can be easily achieved. In the semiconductor device 12 of this embodiment, as described previously, the interval from the end portion of first land 3a and the end portion of the second land 3b, these lands being adjacent to each other, indicated with D in FIG. 2 can be set to about 600 μm. This is smaller by about 200 μm than the interval of about 800 μm from end portion to the end portion of the relay lands 207 adjacent to each other in the second comparative example indicated with X in FIG. 9. Naturally, increase/decrease of area affects by square the length of a side (pitch). However, although in the second comparative example, only 24 pieces of the relay via plugs 206 can be provided in a package about 20 mm square, 32 pieces of the via plugs 4 can be provided in the semiconductor device 12 of this embodiment. That is, the semiconductor device 12 of this embodiment can achieve a mounting density of about 1.3 times the second comparative example.

Next, a stacking method of the chip mounting substrate 201 and the spacer substrate 205 of the second comparative example will be described with reference to FIGS. 10 and 11.

Figure 10:
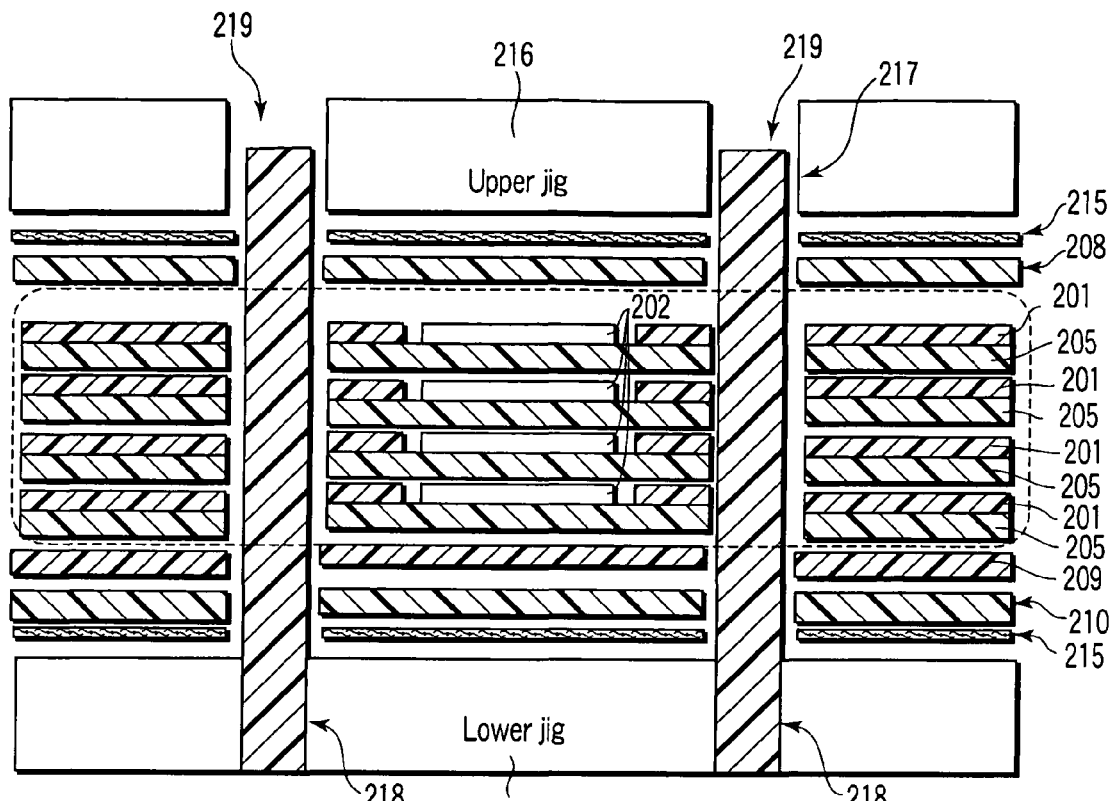
FIG. 10 is a sectional view of process showing the second comparative example of the first embodiment.
Figure 11:
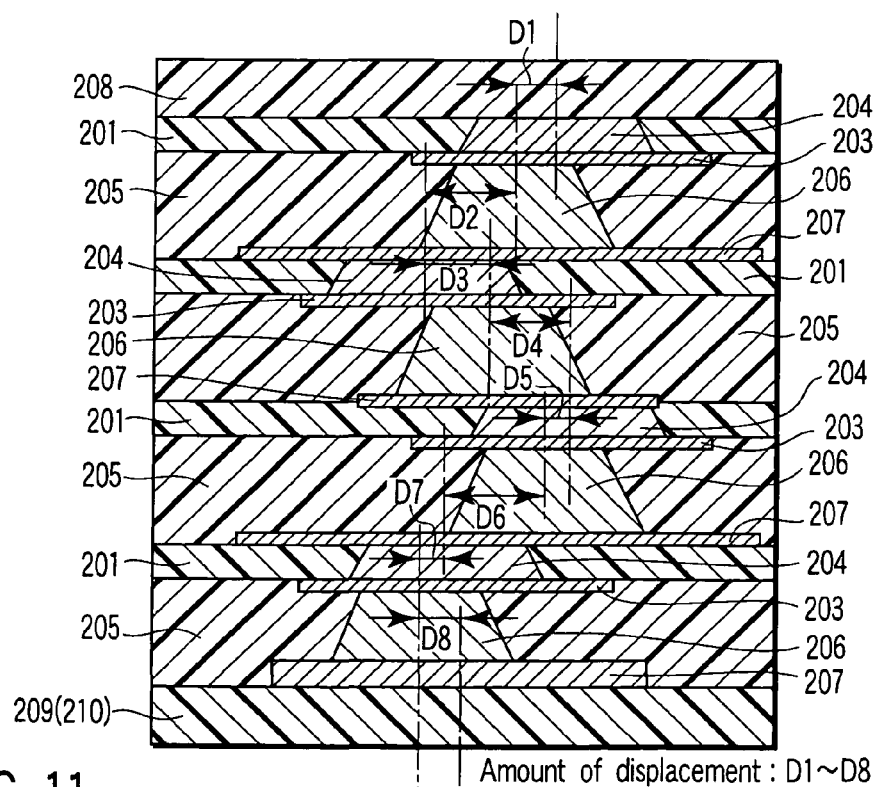
FIG. 11 is a sectional view of process showing the second comparative example of the first embodiment.

As shown in FIG. 10, the four chip mounting substrates 201 and spacer substrates 205, mother board 208, and first/second protective substrates 209, 210, stacked as shown in FIG. 7 are mounted on the lower jig 214. An exfoliate paper 215 is provided between the second protective substrate (lower substrate) 210 and the lower jig 214. An upper jig 216 is mounted on the mother board 208. At this time, the exfoliate paper 215 is provided between the mother board (upper substrate) 208 and the upper jig 216. The chip mounting substrates (IC mounting substrate) 201 and the spacer substrates 205 integrated with each other in each layer are arranged as inner layer substrates in a portion between the mother board 208 and the first protective substrate 209, surrounded by a dashed line in FIG. 10. The respective four chip mounting substrates 201 and spacer substrates 205, the mother board 208, and the first and second protective substrates 209, 210, these substrates being sandwiched by the lower jig 214 and the upper jig 216, are positioned using two resin made positioning pins 217.

In the second comparative example, two positioning pins 217 having a diameter of about 4.95 mm are used. Assume that a lower jig hole 218 through which the positioning pin 217 is to be passed is formed in the lower jig 214 having a diameter of about 4.95 mm. Further, assume that a upper jig hole 219 through which the positioning pin 217 is to be passed is formed in the upper jig 216 having a diameter of about 5.05 mm. Positioning holes 220 are formed in the chip mounting substrates 201 and spacer substrates 205, mother board 208 and first/second protective substrates 209, 210. Under such a setting, the chip mounting substrates 201, the spacer substrates 205, the mother board 208 and the first/second protective substrates 209, 210 are pressed from up and down using the lower jig 214 and upper jig 216. As a result, displacement of at least about 0.05 mm occurs between the chip mounting substrate 201, the spacer substrate 205, the mother board 208 and the first/second protective substrates 209, 210 depending on a difference in the diameter between the positioning pin 217, the lower jig hole 218, the upper jig hole 219 and the positioning hole 220. As a consequence, as described previously, contact failure between the wirings is likely to occur between the substrates 201, 205, 208, 209 and 210.

The relation between an amount of displacement generated in the stacked substrates 201, 205, 208, 209 and 210, the diameters of the via plugs 204, 206, and the diameters of the lands 203, 207 determined by the amount of displacement will be described with reference to FIG. 11. The displacements between the via plugs 204, 206 and the lands 203, 207 in the adjacent substrates 201, 205, 208, 209 and 210 are assumed to be D1, D2, D3, D4, D5, D6, D7, D8 in order from the upper layer to the lower layer as shown in FIG. 11. Allowable errors of processing accuracy (μm) and press accuracy (μm) of each member, which result in the displacement between the via plugs 204, 206 and the lands 203, 207 are determined as follows:

(1) Processing Accuracy (μm)
a: error of position of the via plugs 204, 206<±30 μm
b: error of diameter of the via plugs 204, 206<±10 μm
c: error of position of the lands 203, 207<±30 μm
d: error of diameter of the lands 203, 207<±7.5 μm (2) Press Accuracy (μm)
e: displacement between the substrates 201, 205, 208, 209, 210 in each layer <±50 μm
f: position accuracy of positioning hole 220<±50 μm Total amount of displacement $D_{total}$ of D1 to D8 considering the processing accuracy of each member and press accuracy (alignment accuracy) of each member can be obtained according to a following equation:

$$D_{total} = D1 + D2 + D3 + D4 + D5 + D6 + D7 + D8$$
$$= \sqrt{(a^2 + b^2 + c^2 + d^2 + e^2 + f^2)}$$
$$\cong \pm 83 \, \mu m$$

Therefore, according to the above-described setting, the relation between the diameter of the via plugs 204, 206 and the diameter of the lands 203, 207 can be expressed in a following equation.

Diameter of each land 203, 207 ≧ diameter of each via plug 204, 206±83 μm

That is, the diameter of each land 203, 207 needs to be formed larger by about 83 μm than the diameter of each via plug 204, 206. Thus, in the second comparative example, the intensified density and reduced size of the semiconductor device become much more difficult to achieve than the first comparative example.

Contrary to this, the displacement of the stacking position between the upper wiring substrate 1 and the lower wiring substrate 1 in the stacking type semiconductor device 12 of this embodiment is about 25 µm. Thus, in the stacking type semiconductor device 12 of this embodiment, the connection pitch between the respective substrates 1 and between the respective wirings 2 can be smaller by three or more times than the second comparative example. That is, in the stacking type semiconductor device 12 of this embodiment, the connection pitch between the respective substrates 1 and between the respective wirings 2 can be at finer pitch by three or more than the second comparative example. As a result, the stacking type semiconductor device 12 of this embodiment can be formed in more highly integrated (higher density) and finer structure by three or more than the second comparative example.

Next, a third comparative example of this embodiment will be described with reference to FIGS. 12 to 16. FIGS. 12 to 16 are flowcharts showing the third comparative example of this embodiment. This third comparative example concerns a general manufacturing method of the stacking type semiconductor device.

Figure 12:
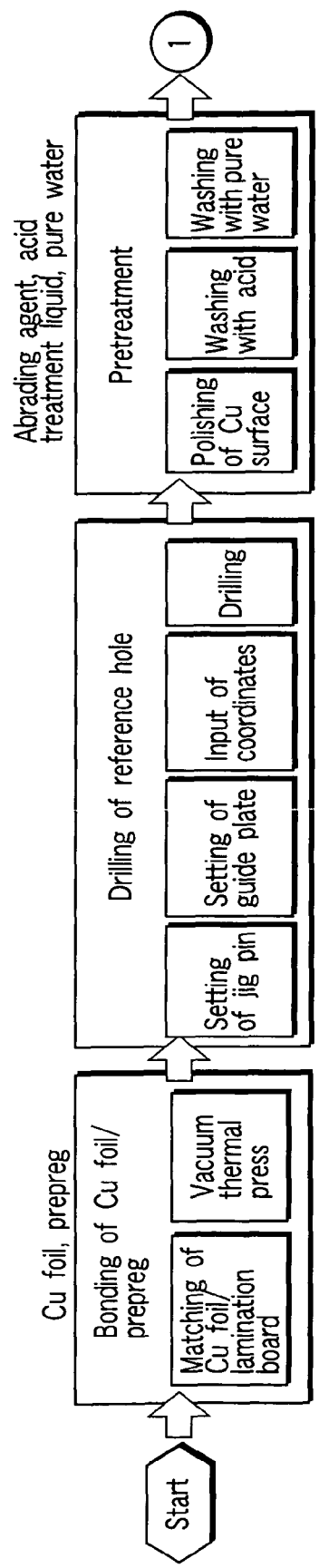
FIG. 12 is a diagram showing a third comparative example of the first embodiment with a flowchart.

First, as shown in FIG. 12, Cu foil and prepreg are bonded to plural stacked substrates. More specifically, first, the Cu foil and prepreg are overlaid on each substrate and those substrates are stacked. After that, vacuum thermal press is applied to these. Next, a positioning reference hole is formed by drilling in each of the substrates on which the Cu foil and prepreg are bonded. More specifically, jig pins are stood to each substrate. Subsequently, a guide plate is set to each substrate. Then, a coordinate of the positioning reference hole for each substrate is input to a drilling machine. After that, the positioning reference hole is formed by drilling in each substrate.

Next, pretreatment using abrading agent, acid treatment liquid and pure water is conducted to each substrate in which the positioning reference hole is formed. More specifically, surface grinding treatment of the Cu foil is conducted to each substrate. Subsequently, wash treatment with acid is conducted to each substrate. After that, wash treatment with pure water is conducted to each substrate. Then, the procedure proceeds to each step in FIG. 13.

Figure 13:
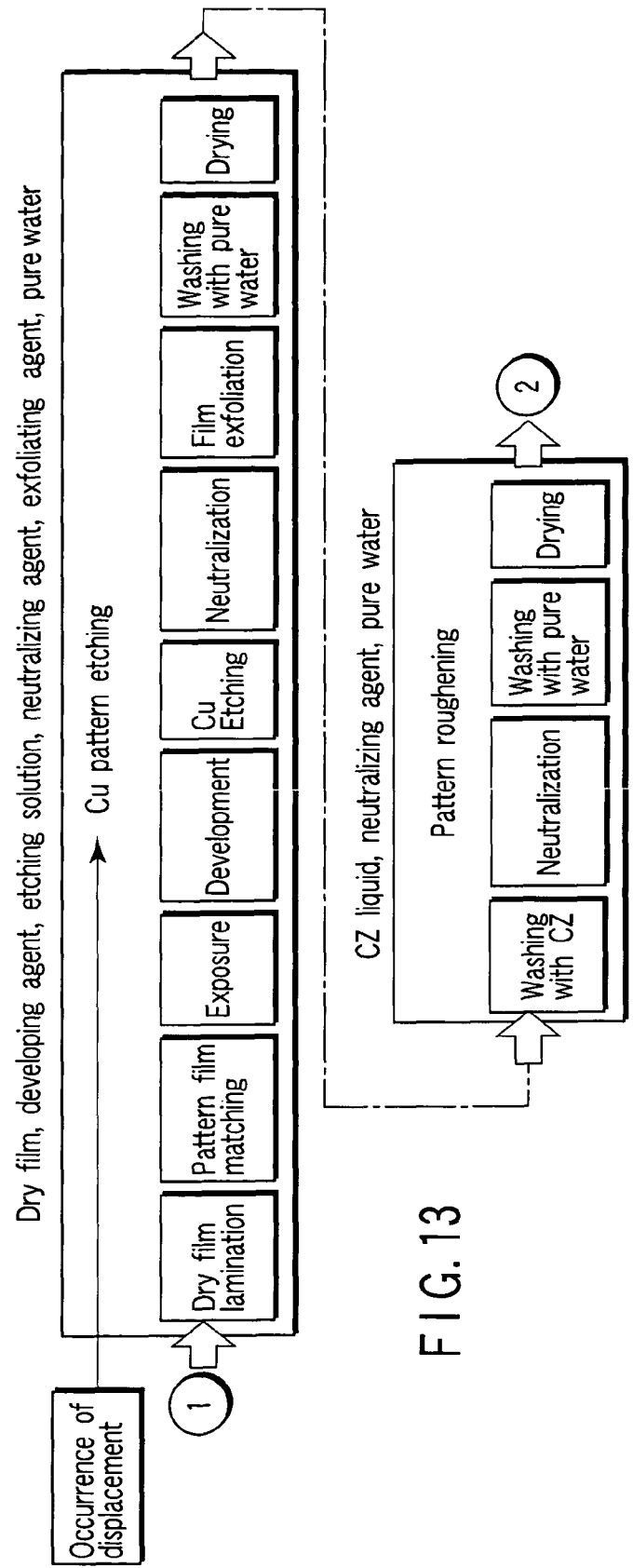
FIG. 13 is a diagram showing the third comparative example continued from FIG. 12, with a flowchart.

Next, Cu pattern etching treatment using dry film, developing agent, etching solution, neutralizing agent, exfoliating agent and pure water is conducted to each substrate undergoing the pretreatment as shown in FIG. 13. More specifically, dry film is stacked to each substrate undergoing the pretreatment. Subsequently, a pattern film is bonded to each substrate. Then, each substrate is exposed to light. Then, development treatment is conducted to each substrate. Then, Cu etching treatment is conducted to each substrate. Then, neutralization is performed to each substrate. Then, film exfoliating treatment is carried out to each substrate. Subsequently, wash treatment with pure water is conducted to each substrate. After this, dry treatment is conducted to each substrate.

Next, pattern etching roughening treatment with CZ liquid, neutralizing agent and pure water is conducted to each substrate undergoing dry treatment. More specifically, CZ wash treatment is carried out to each substrate undergoing dry treatment. Then, neutralizing treatment is conducted to each substrate. Then, wash treatment with pure water is conducted to each substrate. After that, dry treatment is conducted to each substrate. Subsequently, the procedure proceeds to each step shown in FIG. 14.

Figure 14:
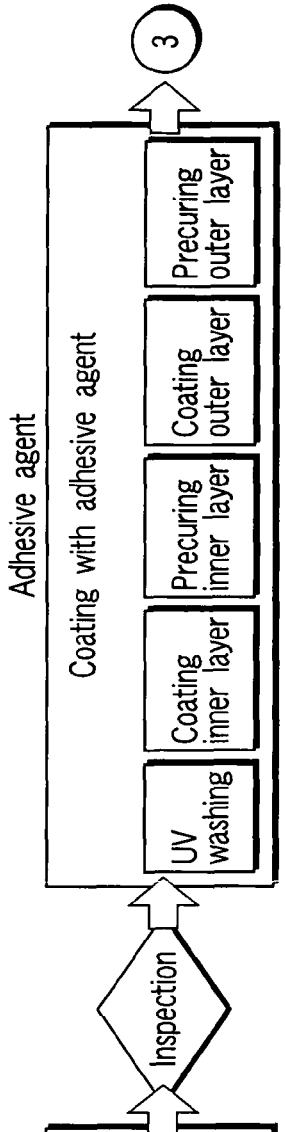
FIG. 14 is a diagram showing the third comparative example continued from FIG. 13, with a flowchart.

Next, Sn plating treatment using Sn plating solution and annealing treatment are carried out to each substrate undergoing dry treatment as shown in FIG. 14. More specifically, each substrate undergoing dry treatment is dipped in a plating bath. Then, wash treatment with pure water is conducted to each substrate. After that, each substrate is placed in an oven so as to execute heating treatment (annealing treatment).

Next, each substrate undergoing heat treatment is brought out of the oven and inspected. If there is no problem on each substrate, the procedure proceeds to a next step.

Next, coating treatment with adhesive agent is conducted to each substrate already inspected. More specifically, UV wash treatment is carried out to each substrate inspected. Subsequently, inner layer coating treatment is executed to each substrate. Subsequently, inner layer pre-cure treatment is conducted to each substrate. Then, outer layer coating treatment is carried out to each substrate. After this, outer layer pre-cure treatment is executed to each substrate. Then, the procedure proceeds to each step shown in FIG. 15.

Figure 15:
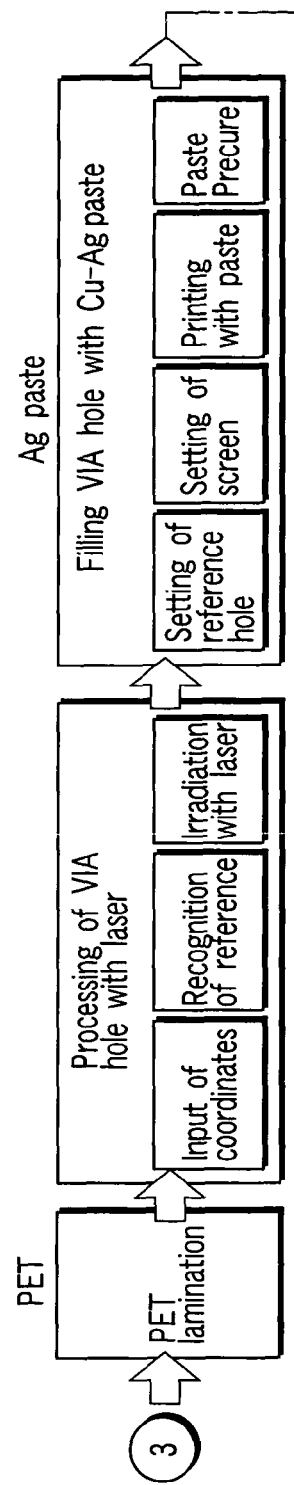
FIG. 15 is a diagram showing the third comparative example continued from FIG. 14, with a flowchart.

Next, PET stacking treatment is carried out to each substrate undergoing outer layer pre-cure treatment as shown in FIG. 15.

Next, via hole processing treatment using laser beam is carried out to each substrate undergoing PET stacking treatment. More specifically, a coordinate of the via hole in each substrate undergoing the PET stacking treatment is input into a via hole processing machine. Subsequently, the via hole processing machine is made to recognize the reference of the via hole. After that, the via hole is formed by irradiating each substrate with laser beam.

Next, processing for filling the via holes formed in each substrate with paste composed of Cu—Ag alloy is conducted. More specifically, a hole which serves as a reference of each substrate in which the via holes are formed is set. Subsequently, a screen is set to each substrate. Then, paste is printed to each substrate. After that, paste pre-cure treatment is carried out to each substrate.

Next, cavity processing treatment is carried out to each substrate undergoing paste pre-cure treatment. More specifically, a coordinate of the cavity of each substrate undergoing the paste pre-cure treatment is input into a cavity processing machine. Subsequently, the cavity processing machine is made to recognize a reference of the cavity. After that, the cavity is formed by irradiating each substrate with laser beam. Subsequently, the procedure proceeds to each step in FIG. 16.

Figure 16:
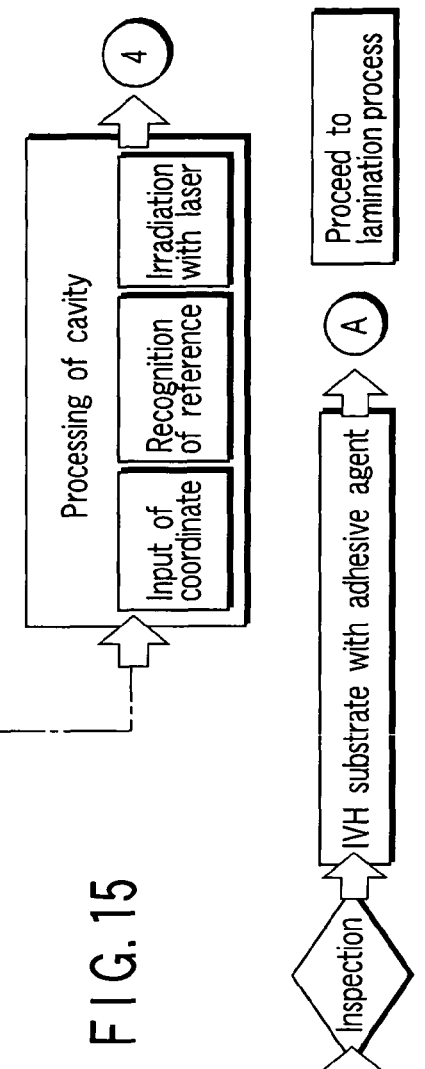
FIG. 16 is a diagram showing the third comparative example continued from FIG. 15, with a flowchart.

Next, PET removing treatment is carried out to each substrate in which the cavity is formed as shown in FIG. 16. More specifically, carrier mount treatment is carried out to each substrate in which the cavity is formed. Then, PET exfoliating treatment is carried out to each substrate.

Next, each substrate undergoing the PET exfoliating treatment is inspected again. If there is no problem in each substrate, the procedure proceeds to a next step.

Next, treatment for processing each substrate undergoing inspection to an inter via hole (IVH) substrate with adhesive agent is carried out. As a result, formation process of a substrate having a desired shape and structure is terminated in a step indicated with A in FIG. 16. After that, a stacking type semiconductor device is produced by feeding each substrate to stacking process.

In such a series of the substrate processing steps, the aforementioned displacement of each substrate is likely to occur in the Cu pattern etching process as indicated with an arrow of solid line in FIG. 13.

Contrary to this, because in the manufacturing process of the stacking type semiconductor device 12 of this embodiment, the positioning pin or the like does not need to be used as described above, there is no likelihood that the displacement of each substrate may occur.

According to the first embodiment, as described previously, it is not necessary to relax allowable errors for displacements in the stacking position between the upper and lower wiring boards 1 in the stacking type semiconductor device 12, respective wirings 2 provided on the upper and lower wiring boards 1, the first and second lands 3a, 3b (3) and pattern of each via plug 4 and the like. Consequently, the respective wirings 2, the first and second lands 3a, 3b(3) and respective via plugs 4 can be formed into a finer pitch while suppressing contact failure between the wirings 2 and the first/second lands 3a, 3b(3) of the upper and lower wiring boards 1. As a result, the freedom of design of the stacking type semiconductor device 12 can be raised to improve the mounting density. For example, the function which is achieved using plural substrates conventionally can be achieved with a single board.

According to this embodiment, as described above, the intensified density (higher integration) and reduced size of the stacking type semiconductor device 12 can be achieved while reducing the percentage of failure occurrence of the stacking type semiconductor device 12. As a result, the performance, quality, reliability and yield of the entire stacking type semiconductor device 12 can be improved. Finally, production efficiency of the stacking type semiconductor device 12 can be improved, thereby reducing production cost of the stacking type semiconductor device 12.

Second Embodiment

Figure 17:
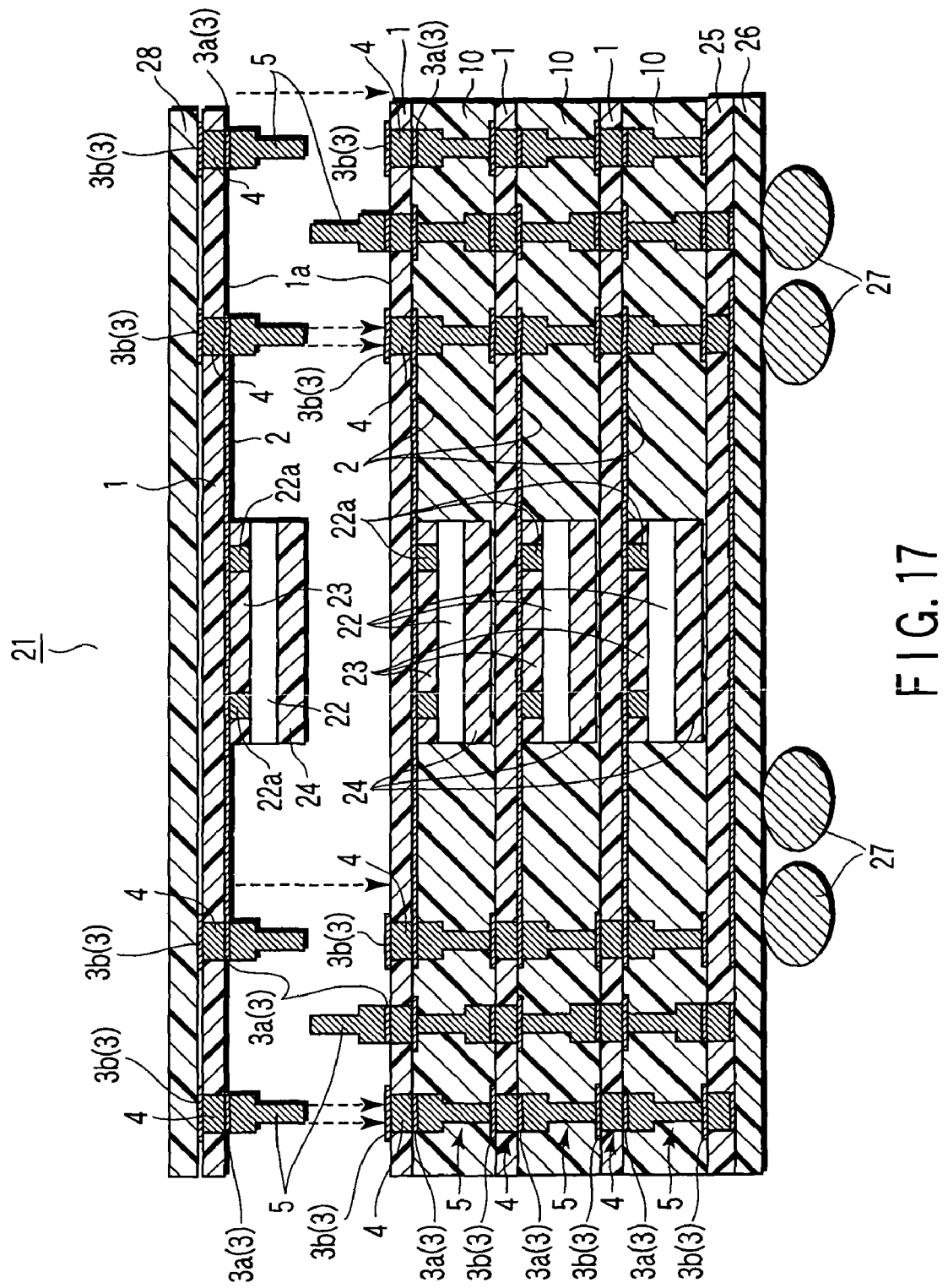
FIG. 17 is a sectional view of process showing manufacturing method of a semiconductor device according to a second embodiment.

Next, the second embodiment of the present invention will be described with reference to FIG. 17. FIG. 17 is a sectional view of process showing a manufacturing method of the semiconductor device of this embodiment. In the meantime, like reference numerals are attached to the same components as the first embodiment and a detailed description thereof is omitted.

This embodiment concerns the structure in which the wiring boards 1 used in the first embodiment are stacked into four layers and each wiring board 1 includes a semiconductor element (semiconductor chip) respectively. Hereinafter, this embodiment will be described more specifically.

As shown in FIG. 17, four pieces of the wiring boards 1 are provided into four layers along the thickness direction in the semiconductor device 21 of this embodiment. A semiconductor element (semiconductor chip) 22 is loaded in the center of the bottom surface (rear surface) 1a which is a major surface of one of each wiring board 1. Accompanied by this, the first land 3a, second land 3b, via plug 4 and stud bump 5 are provided on the peripheral portion of each wiring board 1. Each semiconductor device 22 is connected to the wiring (chip connecting wiring) 2 provided on the bottom surface 1a (1b) of each wiring board (chip mounting substrate) 1 via those electrodes (bumps) 22a. Each chip connecting wiring 2 is connected to the first land 3a as a chip connecting land on the bottom surface 1a (1b) of the chip mounting substrate 1. Sealing resin 23 is provided between the semiconductor chip 22 and the chip mounting substrate 1. Buffer resin (spacer resin) 24 as a spacer for preventing each semiconductor chip 22 from making contact with other chip mounting substrate 1 in adjacent layer so as to interfere therewith is provided on the bottom surface (rear surface) of the semiconductor chip 22.

A mother board (mother substrate) 26 is provided via a relay substrate 25 which is a kind of the wiring board 2 on the bottom side of the chip mounting substrate 1 on the lowermost layer. The relay substrate 25 has the same wiring structure as the wiring substrate 2. A plurality of solder balls 27 as an external connecting terminal for connecting the semiconductor chip 22 to an external device (not shown) electrically are provided on the bottom surface (rear surface) of the mother board 26. A protective substrate 28 for protecting each semiconductor chip 22 and each chip mounting substrate 1 from an impact from outside is provided above the chip mounting substrate 1 on the uppermost layer.

In the stacking type semiconductor device 21 of this embodiment having such a structure, the respective chip connecting wirings 2, the first lands 3a, the second lands 3b, the via plugs 4 and the stud bumps 5 are connected to one another electrically with the same wiring structure as the stacking type semiconductor device 1 of the first embodiment. The semiconductor chip 22 of each layer is held in an appropriate electric connecting condition through the electrodes 22a, chip connecting wirings 2, first lands 3a, second lands 3b, via plugs 4 and stud bumps 5 and connected to a predetermined solder ball 27 electrically through a predetermined conduction passage.

As described previously, according to the second embodiment of the present invention, even when the semiconductor chip 22 is mounted on each wiring board 1, the same effect as the first embodiment can be obtained.

Third Embodiment

Next, the third embodiment of the present invention will be described with reference to FIG. 18. FIG. 18 is a sectional view of process showing a manufacturing method of the semiconductor device of this embodiment. In the meantime, like reference numerals are attached to the same components as the first and second embodiments and a detailed description thereof is omitted.

This embodiment concerns the structure in which the stud bumps 5 used in the first embodiment are stacked into three stages. Hereinafter, this embodiment will be described specifically.

In the stacking type semiconductor device 31 of this embodiment, as shown in FIG. 18, the stud bumps 5 are stacked into three stages on the first land 3a. These stud bumps 5 can be formed easily by carrying out the stud bump method three times continuously.

As described previously, the third embodiment can obtain the same effect as the first and second embodiments. Because the three stud bumps 5 are stacked on the first land 3a, the degrees of integration and reduction in size along the stacking direction are slightly lower than the first and second embodiments. When a variety of elements such as the semiconductor chip 22 are provided on each wiring substrate 1 like the second embodiment, the interval between the adjacent wiring boards 1 can be adjusted freely depending on the thickness of those. Thus, this embodiment excels more in freedom of design in the stacking direction than the first and second embodiments.

In the meantime, the semiconductor device of the present invention is not restricted by the first to third embodiments. The present invention may be carried out by changing part of the structure or the manufacturing process to various settings or combining the various settings appropriately depending on a purpose within a range not departing from the spirit of the invention.

The respective connecting portions 3 arranged on the first and second major surfaces 1a, 1b of the wiring board 1 do not always need to be provided by alternating the small first land 3a and the large second land 3b continuously by pitch. Of the arrangement of the first and second lands 3a, 3b, the first land 3a and the second land 3b need to be provided adjacent to each other at least at a position. With this structure, narrowing of the pitch between the wirings 2 can be achieved at a portion in which the first land 3a and the second land 3b are provided alternately like the first embodiment.

The first land 3a and the second land 3b do not always need be provided alternately by one. For example, the first lands 3a and the second lands 3b may be alternated every two or three. The first land 3a and the second land 3b may be alternated every different quantity from each other depending on a portion in which they are provided. For example, a portion in which the first lands 3a are arranged by three continuously, a portion in which the first lands 3a are arranged by ten continuously and a portion in which the first land 3a is arranged by only one are set on the first and second major surfaces 1a, 1b. Then, a portion in which the second lands 3b are arranged by four continuously, a portion in which the second lands 3b are arranged by only one and a portion in which the second lands 3a are arranged by eight continuously may be set between or adjacent to the portions in which the first lands 3a are arranged. With such a structure, narrowing of the pitch of the wirings 2 can be achieved at that portion alone. Narrowing of the pitch between the wirings 2 can be achieved at the portion in which the first land 3a and the second land 3b are arranged adjacent to each other like the first embodiment.

If the small connecting portion 3a and the large connecting portion 3b are arranged alternately every pitch continuously at least at a place of arrangement of plural connecting portions 3 constituting of plural small connecting portions 3a and plural large connecting portions 3b, provided on the first and second major surfaces 1a, 1b of each wiring board 1, narrowing of the pitch between the wirings 2 can be achieved.

Further, the first connecting portion (small connecting portion) 3a does not always need to be formed as the first land (inter-substrate connecting terminal, connecting land) 3a formed with the same diameter as the width of the wiring 2. Needless to say, part (end portion) of each wiring 2 may be used as the first connecting portion 3a.

Further, the sizes of the respective connecting portions (lands) 3 are not limited to the two sizes, large and small described previously. The respective connecting portions (lands) 3 may be formed into three or more different sizes.

Further, a plurality of the wirings 2 do not always need to be provided on each of the wiring board 1 respectively. It is enough that at least the one wiring 2 to be provided on each of the wiring board 1 respectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    at least two substrates, at least one wiring being provided in each of the substrates, the substrates being stacked such that major surfaces on one side of each thereof oppose each other and the wirings being connected between the major surfaces;
    a plurality of connecting portions, the connecting portions being provided adjacent to each other while connected to each wiring on the major surfaces opposing each other, at least one of the connecting portions provided on the same major surface being formed smaller than the adjacent other connecting portion, the connecting portions being provided at positions opposing each other one to one on the major surface, the connecting portions being connected so that the wirings are connected between the major surfaces, one connecting portion of a pair of the connecting portions connected one to one being formed smaller than the other connecting portion; and
    a plurality of inter-substrate connecting electric conductors provided between the pair of the connecting portions and configured to connect the pair of the connecting portions, each of inter-substrate connecting electric conductors integrally provided on the at least one of the connecting portions formed smaller than the adjacent other connecting portion, wherein
    the connecting portion formed smaller is formed in a size equal to or smaller than the width of the wiring, and the other connecting portion is formed in a size larger than the width of the wiring.

2. A semiconductor device according to claim 1, wherein of the connecting portions provided on the same major surface, at least a connecting portion formed smaller and at least one other connecting portion are provided alternately along the major surface.

3. A semiconductor device according to claim 1, wherein of the pair of the connecting portions, at least a connecting portion formed smaller and at least one other connecting portion are provided with being replaced alternately along the major surface between the major surfaces.

4. A semiconductor device according to claim 1, wherein the connecting portion formed in a smaller size and the other connecting portion are arranged along the major surface of at least one of the substrates such that the connecting portions adjacent to each other are replaced alternately with replacing every interval at continuous plural positions.

5. A semiconductor device according to claim 1, further comprising:
    at least a semiconductor element, the semiconductor element being provided on at least one major surface of the substrate on at least one side.

6. A semiconductor device according to claim 1, further comprising:
    at least a semiconductor element, the semiconductor element being provided between the substrates; and
    at least a buffer member, the buffer member being provided between the semiconductor element and the substrate on the side in which no semiconductor element is mounted.

7. A semiconductor device according to claim 1, further comprising:
    with three or more substrates stacked in the thickness direction, a plurality of semiconductor element, the semiconductor element being provided at least by one on every major surface on at least one side in the stacking direction of the one and the other major surface of each substrate; and
    a plurality of buffer members, the buffer member being provided between the semiconductor element and the substrate adjacent to the substrate on which the semiconductor element is provided directly.

8. A semiconductor device according to claim 1, wherein a semiconductor element is provided in a central portion of the major surface on at least one side of the substrate.

9. A semiconductor device according to claim 1, wherein the connecting portion is provided on the peripheral portion of the major surface on at least one side of the substrate.

10. A semiconductor device according to claim 1, further comprising:

at least a mother board and at least a protective substrate, the mother board and protective substrate being provided on both sides across each substrate.

11. A semiconductor device according to claim 1, wherein the substrate is formed using at least one of polyimide, glass epoxy, BT resin, PET and PCB.

12. A semiconductor device according to claim 1, wherein the inter-substrate connecting electric conductors are formed into a convex shape using a stud bump method.

13. A semiconductor device according to claim 1, wherein the inter-substrate connecting electric conductors are stacked into plural stages between the pair of the connecting portions connected one to one.

14. A semiconductor device according to claim 1, wherein the inter-substrate connecting electric conductors are formed of gold.

* * * * *